(12) United States Patent
Lee et al.

(10) Patent No.: US 11,576,255 B2
(45) Date of Patent: Feb. 7, 2023

(54) FLEXIBLE PRINTED CIRCUIT BOARD AND ELECTRONIC DEVICE INCLUDING THE SAME

(71) Applicant: SAMSUNG ELECTRO-MECHANICS CO., LTD., Suwon-si (KR)

(72) Inventors: Ji Won Lee, Suwon-si (KR); Kwang Youl Pyo, Suwon-si (KR); Chul Hyun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 59 days.

(21) Appl. No.: 17/184,949

(22) Filed: Feb. 25, 2021

(65) Prior Publication Data

US 2022/0151061 A1 May 12, 2022

(30) Foreign Application Priority Data

Nov. 11, 2020 (KR) .......................... 10-2020-0150288

(51) Int. Cl.
*H05K 1/02* (2006.01)
*H05K 1/11* (2006.01)
*H05K 1/18* (2006.01)
*H05K 1/09* (2006.01)

(52) U.S. Cl.
CPC ......... *H05K 1/0281* (2013.01); *H05K 1/0298* (2013.01); *H05K 1/09* (2013.01); *H05K 1/116* (2013.01); *H05K 1/111* (2013.01); *H05K 1/115* (2013.01); *H05K 1/18* (2013.01); *H05K 2201/09481* (2013.01)

(58) Field of Classification Search
CPC ...... H05K 1/0281; H05K 1/0298; H05K 1/09; H05K 1/116; H05K 2201/09481
See application file for complete search history.

(56) References Cited

U.S. PATENT DOCUMENTS

| | | | | |
|---|---|---|---|---|
| 4,931,134 A | * | 6/1990 | Hatkevitz | ............ H05K 3/4691 428/209 |
| 5,121,297 A | * | 6/1992 | Haas | ..................... H05K 3/4691 174/254 |
| 8,269,114 B2 | * | 9/2012 | Nakamura | ........... H05K 1/0281 174/250 |
| 9,940,957 B2 | * | 4/2018 | Yamauchi | .............. G11B 5/484 |
| 2018/0240751 A1 | | 8/2018 | Harr et al. | |

FOREIGN PATENT DOCUMENTS

| | | |
|---|---|---|
| EP | 0883173 A1 | 12/1998 |
| EP | 1083779 A1 | 3/2001 |
| KR | 10-0327887 B1 | 10/2002 |
| KR | 10-0791281 B1 | 1/2008 |
| KR | 10-1669535 B1 | 11/2016 |
| KR | 10-2009905 B1 | 8/2019 |

* cited by examiner

*Primary Examiner* — Ishwarbhai B Patel
(74) *Attorney, Agent, or Firm* — Morgan, Lewis & Bockius LLP

(57) ABSTRACT

A flexible printed circuit board includes: a base film; a first circuit pattern disposed on an upper surface of the base film; a second circuit pattern disposed on a lower surface of the base film; and a boundary reinforcing pattern expanding the first circuit pattern in a width direction of the first circuit pattern based on a virtual boundary along which the first circuit pattern and the second circuit pattern meet each other in an overlay of the first circuit pattern and the second circuit pattern.

17 Claims, 10 Drawing Sheets

FLEXIBLE PRINTED CIRCUIT BOARD AND ELECTRONIC DEVICE INCLUDING THE SAME

CROSS-REFERENCE TO RELATED APPLICATION(S)

This application claims benefit of priority to Korean Patent Application No. 10-2020-0150288 filed on Nov. 11, 2020 in the Korean Intellectual Property Office, the disclosure of which is incorporated herein by reference in its entirety.

TECHNICAL FIELD

The present disclosure relates to a flexible printed circuit board and an electronic device including the same.

BACKGROUND

Recently, as electronic devices such as foldable mobile phones and tablets appear, there is a need for a flexible printed circuit board that is bendable and/or foldable.

In order to implement an electronic device including a flexible display capable of being bent, folded, or the like hundreds of thousands of times, the flexible printed circuit board is required to not only be thin and light but also durable. In a situation in which internal components constituting the flexible printed circuit board are thin, if repeated external forces are continuously applied to the flexible printed circuit board, pattern cracks occur along patterns of conductive wires in the flexible printed circuit board.

SUMMARY

An aspect of the present disclosure may provide a flexible printed circuit board capable of avoiding a crack in a pattern even in the case that repeated external forces are applied to the flexible printed circuit board in a situation in which thin and light conductive wires are used.

Another aspect of the present disclosure may provide a flexible electronic device capable of avoiding a crack in a stepped portion between complicated conductive wire patterns, a crack at a boundary between a conductive wire pattern and a member covering the conductive wire pattern, and a crack at a boundary between a conductive wire pattern and an external terminal pad.

According to an aspect of the present disclosure, a flexible printed circuit board may include: abase film; a first circuit pattern disposed on an upper surface of the base film; a second circuit pattern disposed on a lower surface of the base film; and a boundary reinforcing pattern expanding the first circuit pattern in a width direction thereof based on a virtual boundary along which the first circuit pattern and the second circuit pattern in an overlay of the first circuit pattern and the second circuit pattern.

According to another aspect of the present disclosure, a flexible printed circuit board may include: a first rigid area; and a flexible area connected to the first rigid area and having a smaller thickness than the first rigid area, the flexible area including: a base film; a first circuit pattern disposed on an upper surface of the base film; a second circuit pattern disposed on a lower surface of the base film; and a boundary reinforcing pattern expanding the first circuit pattern in a width direction of the first circuit pattern based on a virtual boundary along which the first circuit pattern and the second circuit pattern meet each other in an overlay of the first circuit pattern and the second circuit pattern.

According to another aspect of the present disclosure, an electronic device may include: a flexible printed circuit board including a flexible area and at least one of a first rigid area and a second rigid area connected to the flexible area; and a display module electrically connected to at least one of the first rigid area and the second rigid area, the flexible area including: a base film; a first circuit pattern disposed on an upper surface of the base film; a second circuit pattern disposed on a lower surface of the base film; and a boundary reinforcing pattern expanding the first circuit pattern in a width direction of the first circuit pattern based on a virtual boundary along which the first circuit pattern and the second circuit pattern meet each other in an overlay of the first circuit pattern and the second circuit pattern.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Flexible Printed Circuit Board

Figure 1:
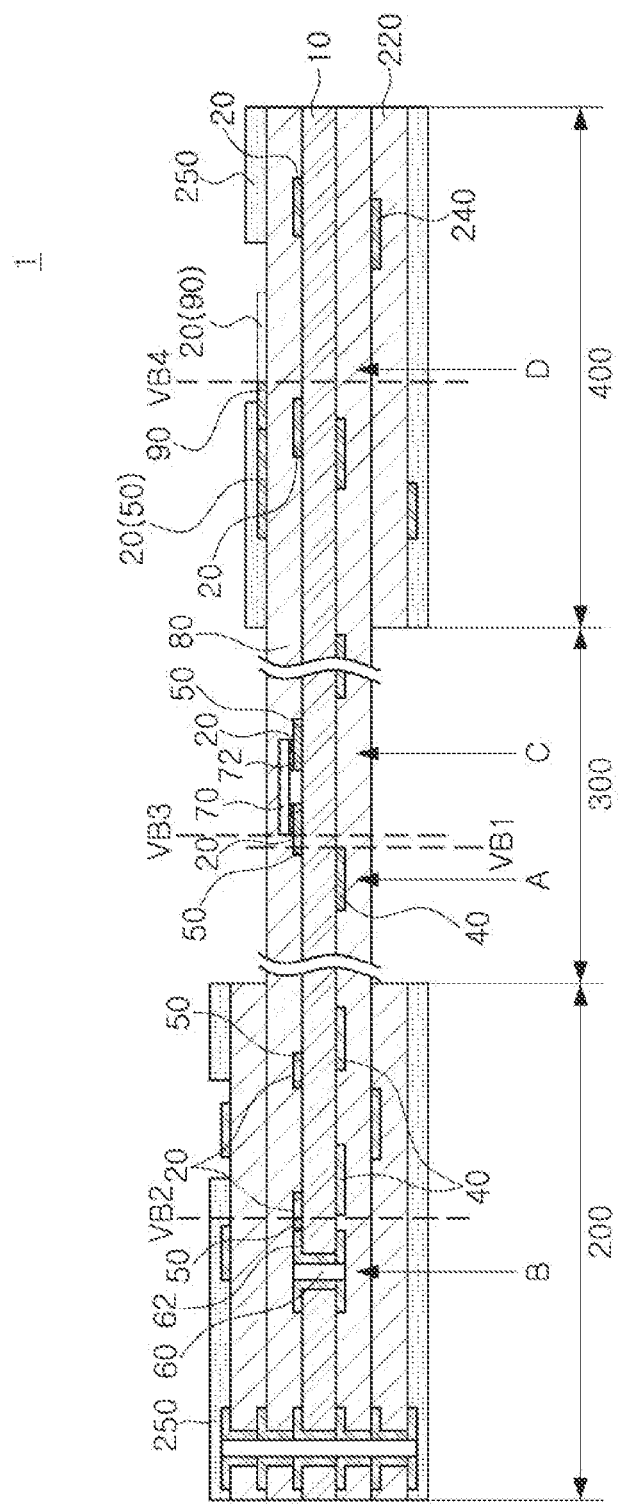
FIG. 1 is a cross-sectional view schematically illustrating a flexible printed circuit board according to an exemplary embodiment in the present disclosure.

FIG. 1 is a cross-sectional view schematically illustrating a flexible printed circuit board according to an exemplary embodiment in the present disclosure.

Referring to FIG. 1, the flexible printed circuit board 1 according to an exemplary embodiment in the present disclosure may include a base film 10, a first circuit pattern 20, a second circuit pattern 40, and a boundary reinforcing pattern 50.

The base film 10 may contain a polyimide (PI) resin having excellent heat resistance, and the material of the base film 10 is not particularly limited as long as it is a heat-resistant insulating coating resin such as polyethylene terephthalate (PET).

The first circuit pattern 20 and the second circuit pattern 40 may be formed of a copper foil on an upper surface and a lower surface of the base film 10, respectively, to form wires through which a current flows.

The base film 10, the first circuit pattern 20, and the second circuit pattern 40 may constitute a flexible copper clad laminate (FCCL) film that is bendable or foldable. The flexible printed circuit board 1 manufactured of such a flexible copper clad laminate film may be applied to a microelectronic device such as a camera of a mobile communication terminal or a next-generation electronic device such as a foldable terminal.

The flexible copper clad laminate film may constitute a flexible area 300 of the flexible printed circuit board 1 according to the present exemplary embodiment, and rigid areas 200 and 400 may be formed by building up insulating layers 220 and wiring layers 240 on the flexible copper clad laminate film. The rigid areas 200 and 400 may be formed at both ends of the flexible area 300 and may constitute a first rigid area 200 and a second rigid area 400, respectively. If required by an electronic device, the rigid areas 200 and 400 may not be included in the flexible printed circuit board 1, or only one of the first rigid area 200 and the second rigid area 400 may be formed in the flexible printed circuit board 1.

Each of the first rigid area 200 and the second rigid area 400 is for relatively describing an area that is more difficult to bend or fold than the flexible area 300, and it should be understood that the first rigid area 200 and the second rigid area 400 are not to be interpreted as areas that are not bendable or foldable.

The rigid-flexible printed circuit board including the first rigid area 200, the second rigid area 400, and the flexible area 300 is an example of the flexible printed circuit board 1 according to the present disclosure.

The first rigid area 200 and the second rigid area 400 are multilayer circuit boards in which the insulating layers 220 and the wiring layers 240 are built up on the flexible copper clad laminate film, and the number of layers may be selected as needed. The method of forming the rigid regions is not limited thereto.

Passivation layers 250 may be formed on the outermost layers in the first rigid area 200 and the second rigid area 400 to protect internal components of the printed circuit board from external physical and chemical damage. The passivation layers 250 may be photo solder resist (PSR), but are not limited thereto.

Passivation layers 80 for protecting the first circuit pattern 20 and the second circuit pattern 40 may also be formed in the flexible area 300 to protect internal components of the printed circuit board from external physical and chemical damage. The passivation layers 80 may be photo solder resist (PSR), but are not limited thereto.

Figure 2:
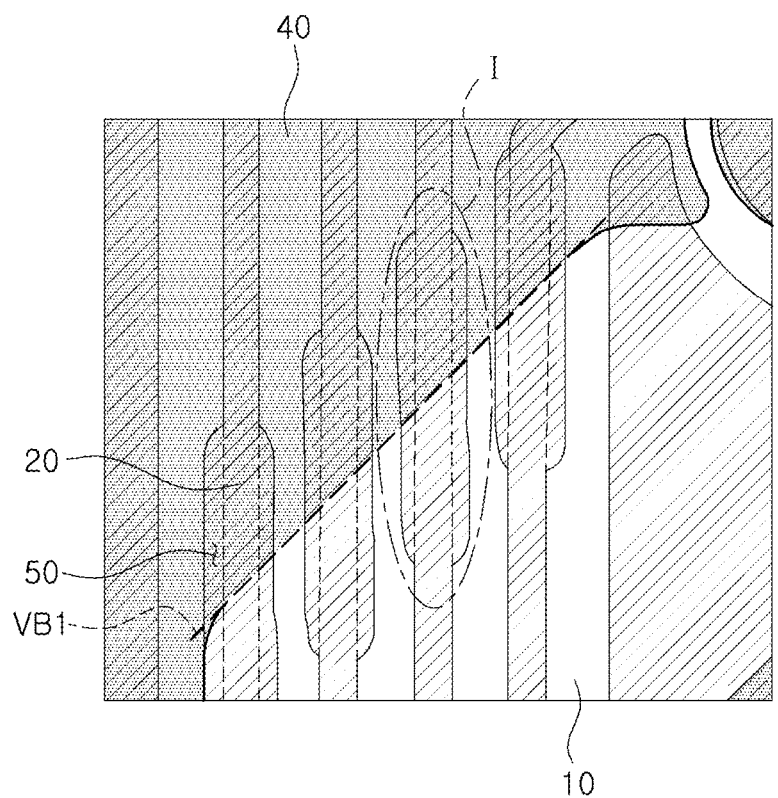
FIG. 2 is a schematic perspective bottom view of the flexible printed circuit board viewed from A of FIG. 1, in which a circuit pattern on each layer is illustrated.
Figure 3:
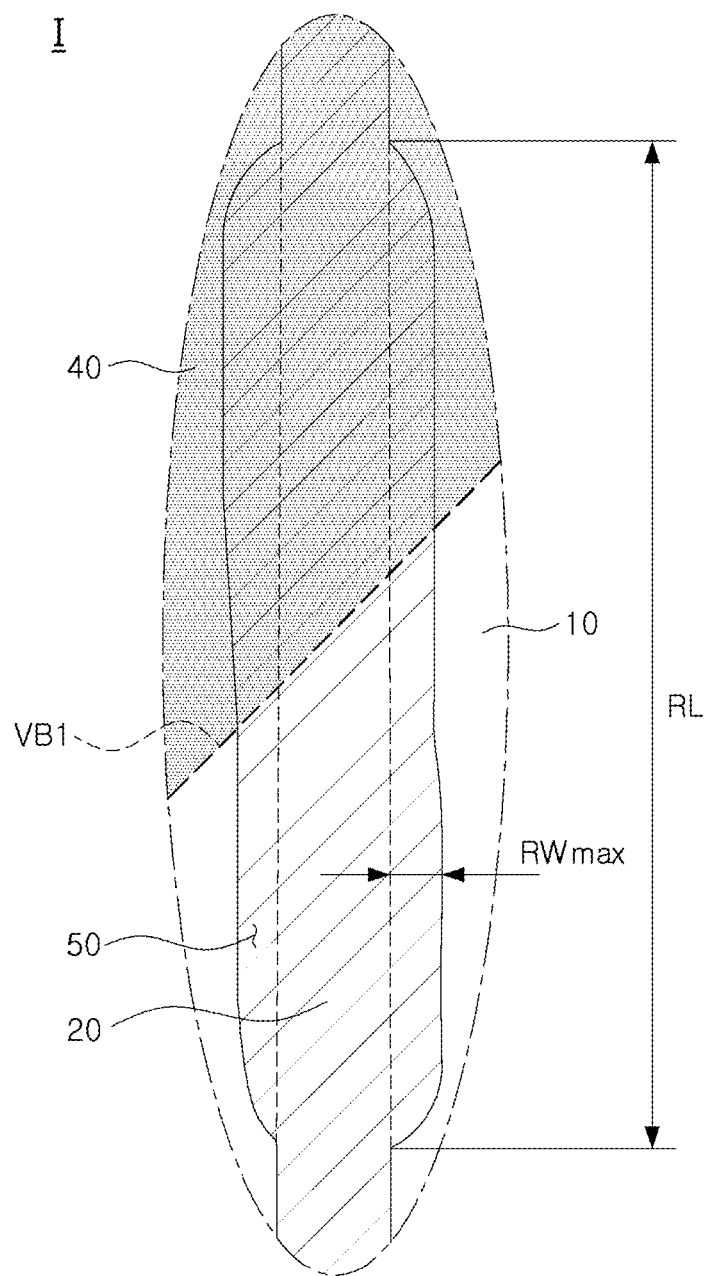
FIG. 3 is an enlarged schematic view illustrating portion I of FIG. 2.

FIG. 2 is a schematic perspective bottom view of the flexible printed circuit board viewed from A of FIG. 1, in which a circuit pattern on each layer is illustrated, and FIG. 3 is an enlarged schematic view illustrating portion I of FIG. 2.

Referring to FIGS. 1 through 3, the flexible printed circuit board 1 may further include a boundary reinforcing pattern 50.

The boundary reinforcing pattern 50 according to the present exemplary embodiment may be formed to expand the first circuit pattern 20 in a width direction thereof based on a virtual boundary VB1 along which the first circuit pattern 20 and the second circuit pattern 40 meet each other with the base film 10 being interposed therebetween. In this case, a combined pattern structure of the boundary reinforcing pattern 50 and the first circuit pattern 20 which the boundary reinforcing pattern 50 is connected to may have a width greater than the first circuit pattern 20 which the boundary reinforcing pattern 50 is not connected to. That is, an overall pattern including the first circuit pattern 20 and the boundary reinforcing pattern 50 in a region where the boundary reinforcing pattern 50 expands from or extends from the first circuit pattern 20 may have a width greater than the width of the first circuit pattern 20 in a region where only the first circuit pattern 20 is disposed.

It is illustrated that the boundary reinforcing pattern 50 according to the present exemplary embodiment is in the first rigid area 200, but the boundary reinforcing pattern 50 may also be formed in the flexible area 300 or the second rigid area 400 depending on the shapes or types of the first circuit pattern 20 and the second circuit pattern 40.

In one example, the virtual boundary VB1 according to the present exemplary embodiment is a virtual extension line that is a line extending from an end of the second circuit pattern 40, formed on the lower surface of the base film 10, in a thickness direction thereof and passing through the first circuit pattern 20. In another example, the virtual boundary VB1 according to the present exemplary embodiment is a projection of an end of the second circuit pattern 40 in the thickness direction thereof and passing through the first circuit pattern 20. In another example, the first circuit pattern 20 and the second circuit pattern 40 meet each other in an overlay (or a plan view) of the first circuit pattern 20 and the second circuit pattern 40 at the virtual boundary VB1. The virtual boundary VB1 is illustrated in FIG. 2, a perspective bottom view, as extending the end of the second circuit pattern 40 in the copper foil structure. When the first circuit pattern is formed on the virtual boundary VB1, the boundary reinforcing pattern 50 may be formed to expand the first circuit pattern 20 in the width direction thereof. The second circuit pattern 40 corresponding to the first circuit pattern 20 may have a width of 400 µm or more.

The circuit patterns 20 and 40 of the flexible printed circuit board 1 may be formed using copper foils. In order to particularly reduce a thickness of the copper foils, rolled anealed (RA) copper foils may be used. However, if necessary, electro-deposited (ED) copper foils may be used, and the method of forming the copper foils is not particularly limited.

In a process of manufacturing the flexible printed circuit board 1, exposure, development, etching, etc. are carried out in a state in which the copper films are formed to have a small width of 90 µm or less and the flexible copper clad laminate (FCCL) film on which the copper films are formed is rolled with roll-to-roll (RTR) equipment in order to increase a circuit density of the flexible printed circuit board 1.

The boundary reinforcing pattern 50 may prevent or delay a crack in the first circuit pattern 20 that may occur at the virtual boundary VB1 for the manufacturing process-related reasons such as the use of thin copper foils and the tension applied to the flexible copper clad laminate film by the roll-to-roll equipment.

The boundary reinforcing pattern 50 may be formed of the same material as the copper foil of the first circuit pattern 20, and the boundary reinforcing pattern 50 may be formed to have a reinforcement length RL of 10 or less times a maximum reinforcement width RWmax. The reinforcement length RL refers to a length of the boundary reinforcing pattern 50 extending in a length direction of the first circuit pattern 20 based on the virtual boundary VB1 between the first circuit pattern 20 and the second circuit pattern 40, and the maximum reinforcement width RWmax refers to a width of the boundary reinforcing pattern 50 extending maximally in the width direction of the first circuit pattern 20.

When the first circuit pattern 20 has a width of 90 μm or less, the boundary reinforcing pattern 50 may be applied thereto, with the reinforcement length RL being set to 300 μm (150 μm on each of both sides based on the boundary) and the maximum reinforcement width RWmax being set to 30 μm, so that cracks are reduced in the process of manufacturing the flexible printed circuit board 1 in the roll-to-roll equipment.

Figure 4:
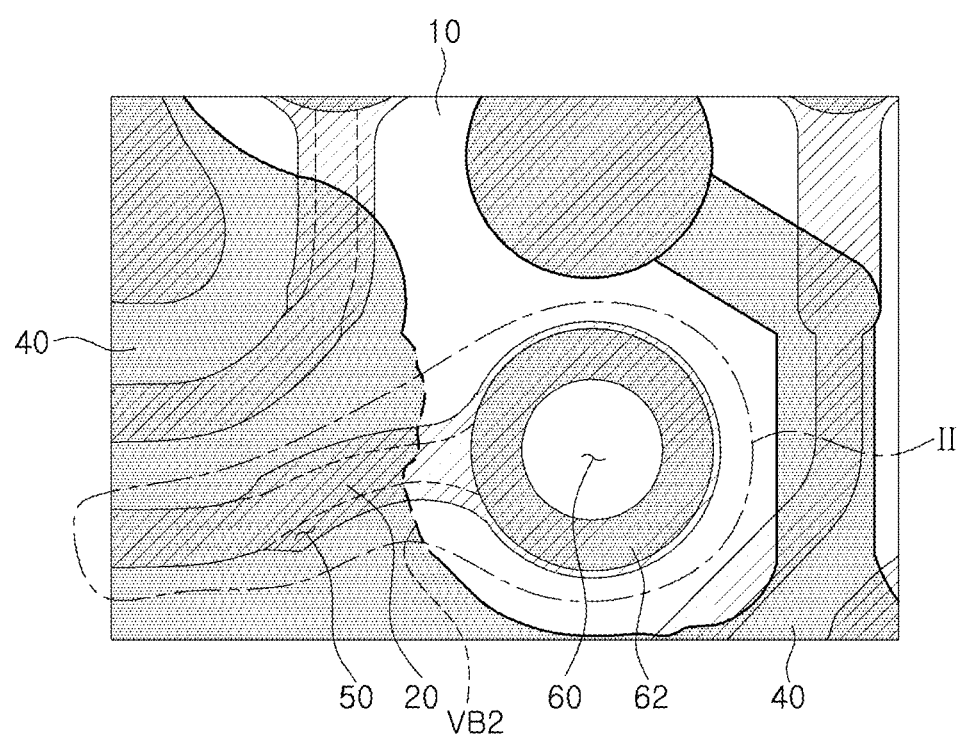
FIG. 4 is a schematic perspective bottom view of the flexible printed circuit board viewed from B of FIG. 1, in which a circuit pattern on each layer is illustrated.
Figure 5:
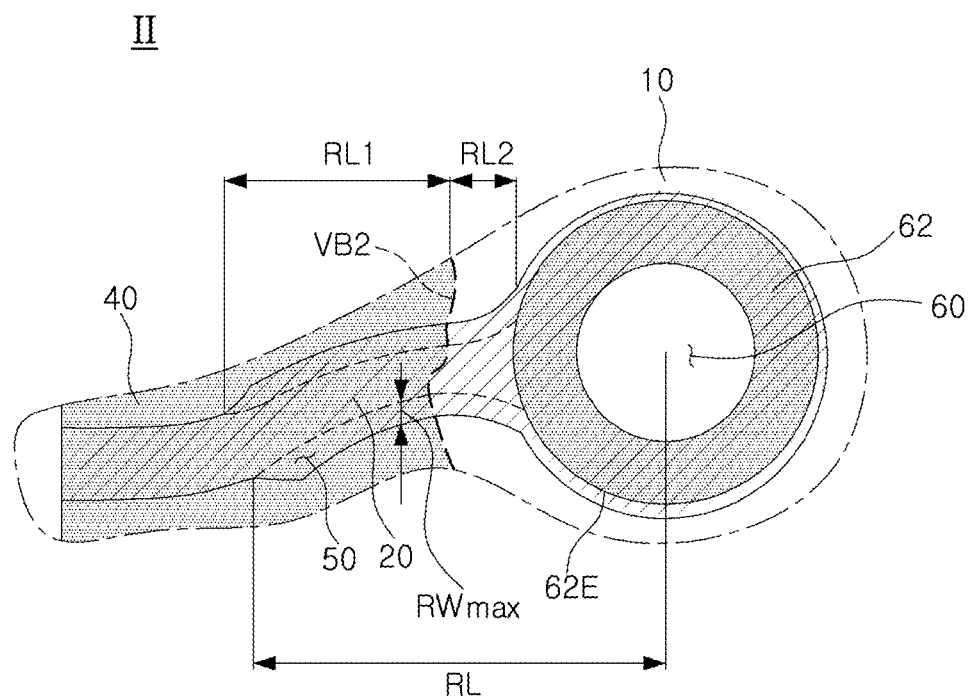
FIG. 5 is an enlarged schematic view illustrating portion II of FIG. 4.

FIG. 4 is a schematic perspective bottom view of the flexible printed circuit board viewed from B of FIG. 1, in which a circuit pattern on each layer is illustrated, and FIG. 5 is an enlarged schematic view illustrating portion II of FIG. 4.

Referring to FIGS. 1, 4, and 5, the flexible printed circuit board 1 may have a via hole 60 penetrating through the base film 10 and electrically connecting the first circuit pattern 20 and the second circuit pattern 40 to each other. In addition, the flexible printed circuit board 1 may include a boundary reinforcing pattern 50 according to another exemplary embodiment.

The first circuit pattern 20 may include a land portion 62 of the via hole 60. When the boundary reinforcing pattern 50 is adjacent to the land portion 62, a length RL1 of the boundary reinforcing pattern 50 from one of both ends thereof located further from the land portion 62 to a virtual boundary VB2 may be greater than a length RL2 of the boundary reinforcing pattern 50 extending from the virtual boundary VB2 to an edge 62E of the land portion 62.

The boundary reinforcing pattern 50 adjacent to the land portion 62 according to the present exemplary embodiment may be formed to expand the first circuit pattern 20 in a width direction thereof based on the virtual boundary VB2 along which the first circuit pattern 20 and the second circuit pattern 40 meet each other with the base film 10 being interposed therebetween. In this case, a combined structure of the boundary reinforcing pattern 50 and a portion of the first circuit pattern 20 which the boundary reinforcing pattern 50 is connected to may have a width greater than another portion of the first circuit pattern 20 which the boundary reinforcing pattern 50 is not connected to. That is, an overall pattern including the first circuit pattern 20 and the boundary reinforcing pattern 50 in a region where the boundary reinforcing pattern 50 expands from or extends from the first circuit pattern 20 may have a width greater than the width of the first circuit pattern 20 in a region where only the first circuit pattern 20 among the first circuit pattern 20 and the boundary reinforcing pattern 50 is disposed.

It is illustrated that the boundary reinforcing pattern 50 according to the present exemplary embodiment is in the first rigid area 200, but the boundary reinforcing pattern 50 may also be formed in the flexible area 300 or the second rigid area 400 depending on the shapes or types of the first circuit pattern 20 and the second circuit pattern 40.

In one example, the virtual boundary VB2 according to the present exemplary embodiment is a virtual extension line that is a line extending from an end of the second circuit pattern 40, formed on the lower surface of the base film 10, in a thickness direction thereof and passing through the first circuit pattern 20. In another example, the virtual boundary VB2 according to the present exemplary embodiment is a projection of an end of the second circuit pattern 40 in the thickness direction thereof and passing through the first circuit pattern 20. In another example, the first circuit pattern 20 and the second circuit pattern 40 meet each other in an overlay (or a plan view) of the first circuit pattern 20 and the second circuit pattern 40 at the virtual boundary VB2. The virtual boundary VB2 is illustrated in FIG. 4, a perspective bottom view, as extending the end of the second circuit pattern 40 in the copper foil structure. When the first circuit pattern 20 is formed on the virtual boundary VB2, the boundary reinforcing pattern 50 may be formed to expand the first circuit pattern 20 in the width direction thereof.

It has been described in the exemplary embodiment of FIG. 2 that why the characteristics of the process of manufacturing the flexible printed circuit board 1, such as the use of thin copper foils and the tension applied to the flexible copper clad laminate film by the roll-to-roll equipment, cause cracks. Thus, the detailed description thereof will be omitted.

Figure 6:
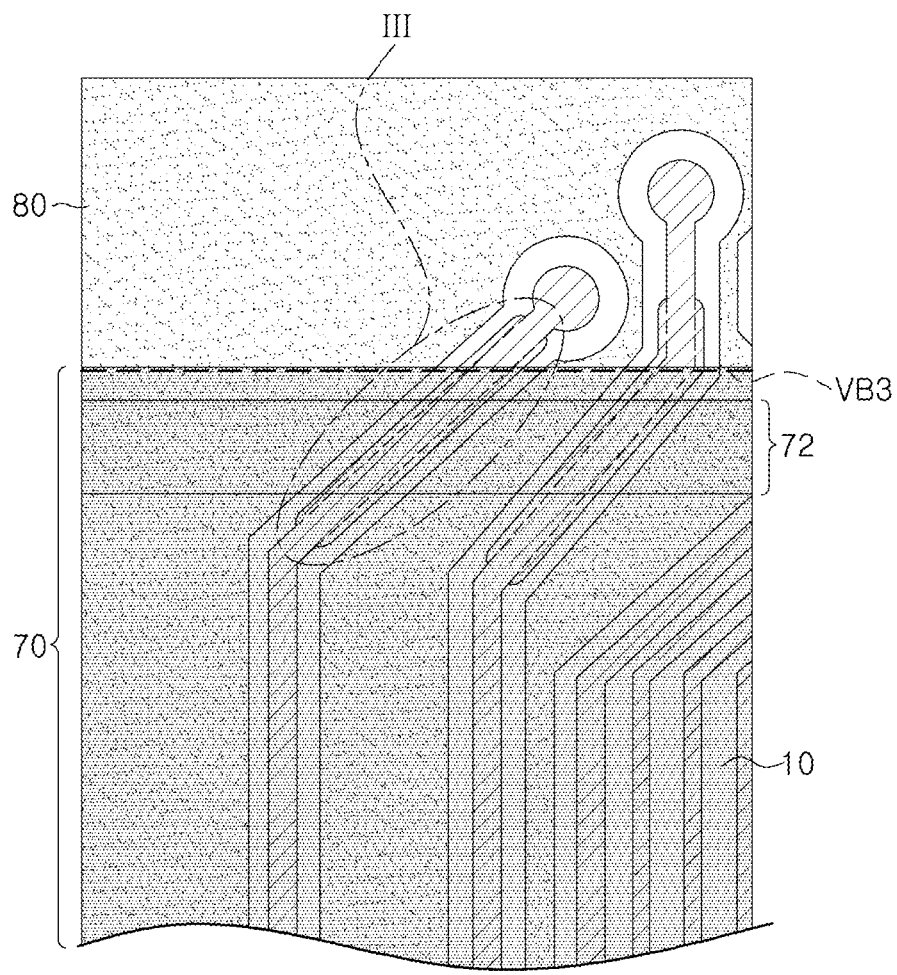
FIG. 6 is a schematic perspective bottom view of the flexible printed circuit board viewed from C of FIG. 1, in which a circuit pattern on each layer is illustrated.
Figure 7:
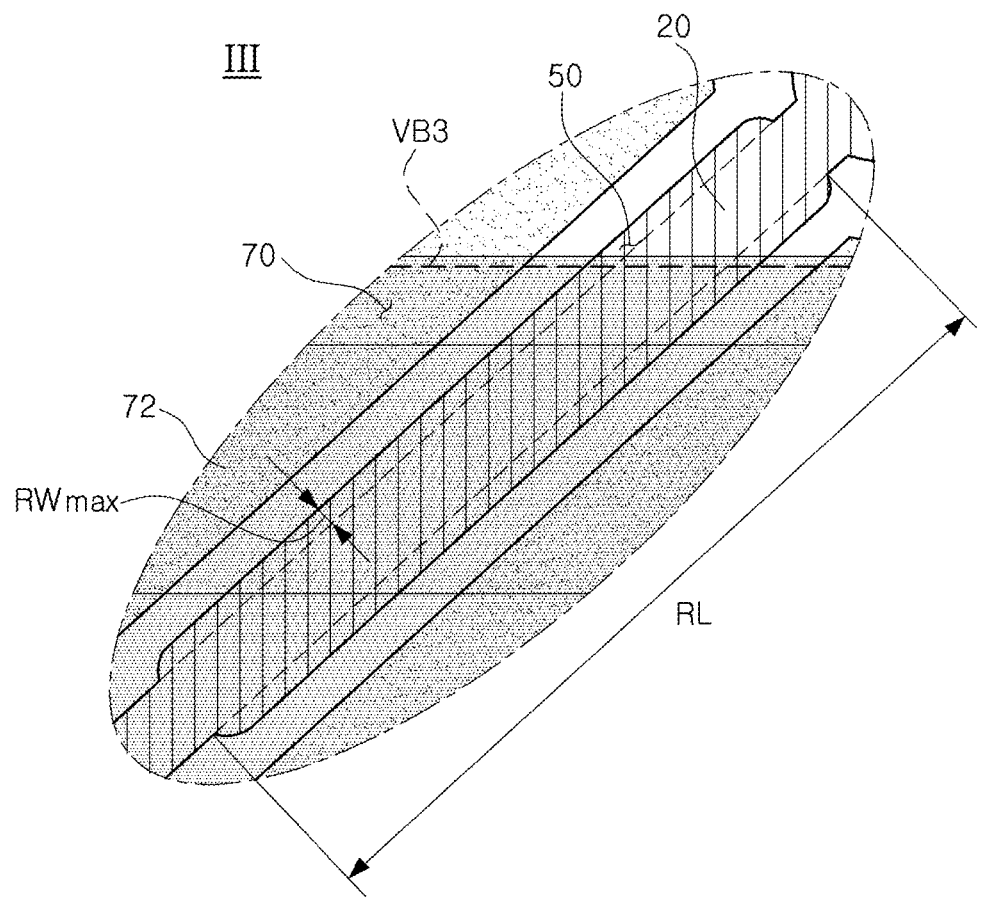
FIG. 7 is an enlarged schematic view illustrating portion III of FIG. 6.

FIG. 6 is a schematic perspective bottom view of the flexible printed circuit board viewed from C of FIG. 1, in which a circuit pattern on each layer is illustrated, and FIG. 7 is an enlarged schematic view illustrating portion III of FIG. 6.

Referring to FIGS. 1, 6, and 7, the flexible printed circuit board 1 according to the present exemplary embodiment may include a base film 10, a first circuit pattern 20 formed on an upper surface of the base film 10, and a coverlay film 70 covering the first circuit pattern 20.

The coverlay film 70 may be a sheet used as a solder resist of the flexible printed circuit board, and the coverlay film 70 may be connected to the first circuit pattern 20 by an adhesive 72. Here, as the adhesive 72, prepreg obtained by impregnating a thermosetting resin in a base material such as a glass fiber and then curing the base material with the thermosetting resin impregnated therein up to B-stage (a semi-cured state of the resin) may be used, and the material of the adhesive 72 is not limited thereto.

The flexible printed circuit board 1 according to the present exemplary embodiment may further include a boundary reinforcing pattern 50 formed to expand the first circuit pattern 20 in a width direction thereof based on a virtual boundary VB3 between the coverlay film 70 and the first circuit pattern 20. In this case, a combined structure of the boundary reinforcing pattern 50 and a portion of the first circuit pattern 20 which the boundary reinforcing pattern 50 is connected to may have a width greater than another portion of the first circuit pattern 20 which the boundary reinforcing pattern 50 is not connected to. That is, an overall pattern including the first circuit pattern 20 and the boundary reinforcing pattern 50 in a region where the boundary reinforcing pattern 50 expands from or extends from the first circuit pattern 20 may have a width greater than the width of the first circuit pattern 20 in a region where only the first circuit pattern 20 among the first circuit pattern 20 and the boundary reinforcing pattern 50 is disposed.

The boundary reinforcing pattern 50 formed based on the virtual boundary VB3 may prevent or delay a crack occurring due to a pressure difference between a portion to which the coverlay film 70 adheres and a portion to which the coverlay film 70 does not adhere.

When the coverlay film 70 is attached to the first circuit pattern 20 by the adhesive 72, strong pressure may be generated, and accordingly, a crack may occur at the boundary between the first circuit pattern 20 and the coverlay film 70. For this reason, the reinforcing circuit pattern 50 may reinforce the first circuit pattern 20 in a range in which the adhesive 72 is applied to the first circuit pattern 20.

In one example, the virtual boundary VB3 according to the present exemplary embodiment is a line extending a boundary between the first circuit pattern 20 and the coverlay film 70 in the thickness direction of the flexible printed circuit board 1. In another example, the virtual boundary VB3 according to the present exemplary embodiment is a projection of an end of the coverlay film 70 in the thickness direction thereof and passing through the first circuit pattern 20. In another example, the first circuit pattern 20 and the coverlay film 70 meet each other in an overlay (or a plan view) of the first circuit pattern 20 and the coverlay film 70 at the virtual boundary VB3. The virtual boundary VB3 is illustrated in FIG. 6, a perspective bottom view, as extending an end of the coverlay film 70 covering the first circuit pattern 20. When the first circuit pattern is formed on the virtual boundary VB3, the boundary reinforcing pattern 50 may be formed to expand the first circuit pattern 20 in the width direction thereof.

When the first circuit pattern 20 has a width of 120 μm or less, the boundary reinforcing pattern 50 may be applied thereto, with a reinforcement length RL being set to 800 μm (600 μm in an internal direction of the coverlay film 70 and 200 μm in an external direction of the coverlay film 70, based on the boundary) and a maximum reinforcement width RWmax being set to 20 μm, so that cracks are reduced in the process of manufacturing the flexible printed circuit board 1 in the roll-to-roll equipment.

That is, the reinforcement length RL of the boundary reinforcing pattern 50 may be determined to be 40 or less times the maximum reinforcement width RWmax.

Figure 8:
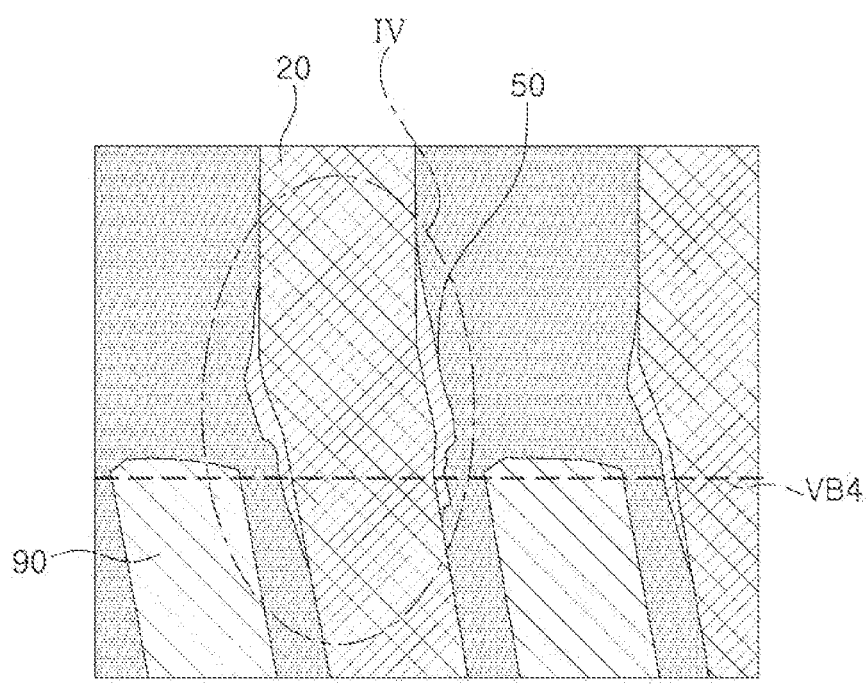
FIG. 8 is a schematic perspective bottom view of the flexible printed circuit board viewed from D of FIG. 1, in which a circuit pattern on each layer is illustrated.
Figure 9:
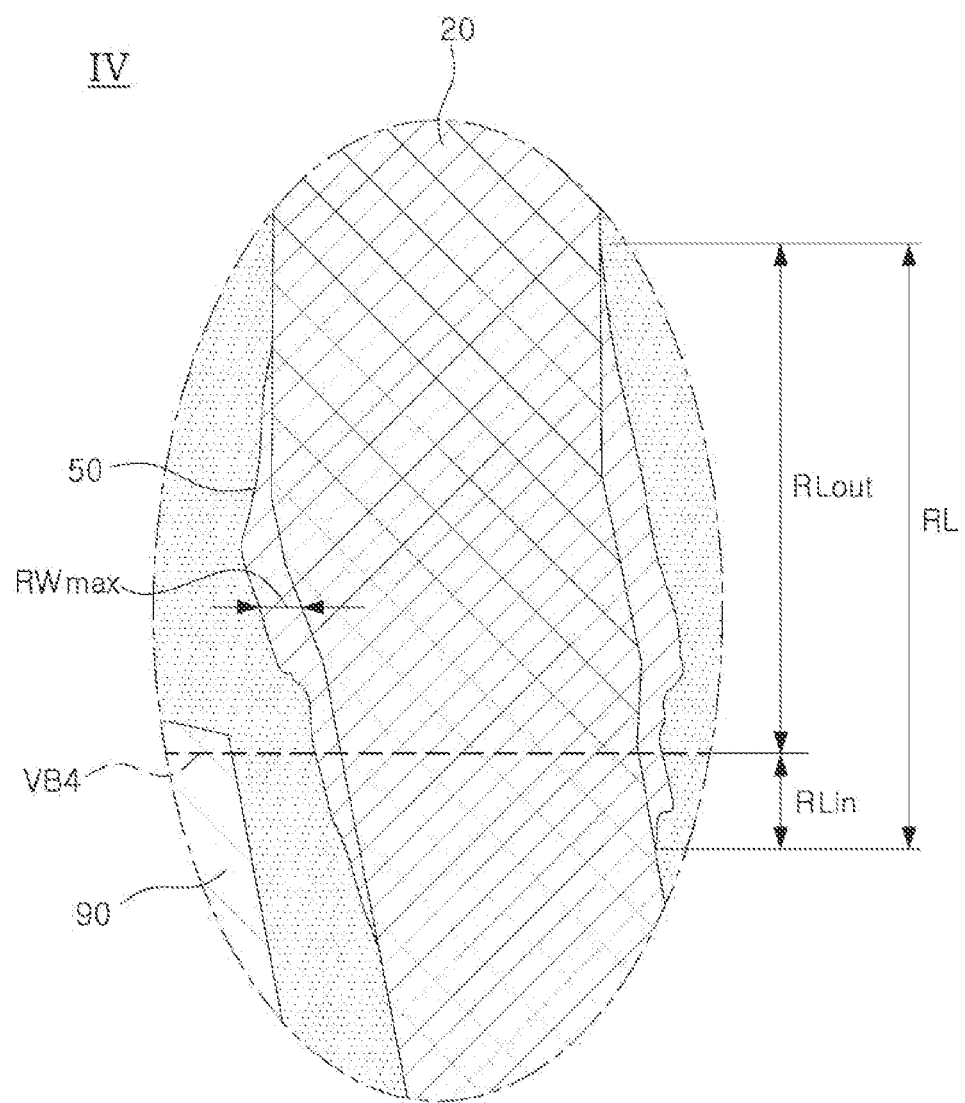
FIG. 9 is an enlarged schematic view illustrating portion IV of FIG. 8.

FIG. 8 is a schematic perspective bottom view of the flexible printed circuit board viewed from D of FIG. 1, in which a circuit pattern on each layer is illustrated, and FIG. 9 is an enlarged schematic view illustrating portion IV of FIG. 8.

Referring to FIGS. 1, 8, and 9, the flexible printed circuit board 1 according to the present exemplary embodiment may include a base film 10, a first circuit pattern 20 formed on an upper surface of the base film 10, and an external terminal pad 90 on which an electronic component is mounted.

It is illustrated that the external terminal pad 90 is in the second rigid area 400, but the external terminal pad 90 may also be formed in the first rigid area 200 if a driving circuit of a display module is also connected to the first rigid area 200.

The external terminal pad 90 may be a connection terminal for mounting an electronic component (an integrated circuit (IC) chip, a display module, etc.) of an electronic device on the flexible printed circuit board 1. The electronic component (an integrated circuit (IC) chip, a display module, etc.) of the electronic device may be mounted on the flexible printed circuit board 1 through various mounting methods such as a tape automated bonding (TAB) method, a chip-on-glass (COG) method, or a film-on-glass (FOG) method. In the present exemplary embodiment, the external terminal pad 90 used in the FOG method will be described.

Here, the film-on-glass (FOG) method is a method in which an anisotropic conductive film is attached to a liquid crystal panel, a flexible printed circuit board is disposed on the anisotropic conductive film, and then an electronic component is directly mounted on the flexible printed circuit board by pressurization.

The flexible printed circuit board 1 according to the present exemplary embodiment may further include a boundary reinforcing pattern 50 formed to expand the first circuit pattern 20 in a width direction thereof based on a virtual boundary VB4 passing through the first circuit pattern 20 and an end of the external terminal pad 90 provided for use in the FOG mounting method.

When the first circuit pattern 20 to which the external terminal pad 90 is connected forms a circuit wiring (etching), the boundary reinforcing pattern 50 may reduce cracks that may occur when the circuit pattern is etched in a large amount due to a different flow rate of an etching solution in a space between the first circuit pattern 20 and the external terminal pad 90, larger than a space between circuit patterns 20.

The virtual boundary VB4 according to the present exemplary embodiment is a line extending a boundary between the first circuit pattern 20 and the end of the adjacent external terminal pad 90 in the thickness direction of the flexible printed circuit board 1. The virtual boundary VB4 is illustrated in FIG. 8, a perspective bottom view, as extending an end of the adjacent external terminal pad 90 and the first circuit pattern 20. When the first circuit pattern 20 is formed on the virtual boundary VB4, the boundary reinforcing pattern 50 may be formed to expand the first circuit pattern 20 in the width direction thereof. In this case, a combined structure of the boundary reinforcing pattern 50 and a portion of the first circuit pattern 20 which the boundary reinforcing pattern 50 is connected to may have a width greater than another portion of the first circuit pattern 20 which the boundary reinforcing pattern 50 the boundary reinforcing pattern 50 is not connected to. That is, an overall pattern including the first circuit pattern 20 and the boundary reinforcing pattern 50 in a region where the boundary reinforcing pattern 50 expands from or extends from the first circuit pattern 20 may have a width greater than the width of the first circuit pattern 20 in a region where only the first circuit pattern 20 among the first circuit pattern 20 and the boundary reinforcing pattern 50 is disposed.

When the first circuit pattern 20 has a width of 90 μm or less, the boundary reinforcing pattern 50 may be applied thereto, with a reinforcement length RL being set to 80 μm (20 μm in an internal direction of the external terminal pad 90 and 60 μm in an external direction of the external terminal pad 90, based on the boundary) and a maximum reinforcement width RWmax being set to 10 μm, so that cracks are reduced in the process of manufacturing the flexible printed circuit board 1 in the roll-to-roll equipment.

That is, the reinforcement length RL of the boundary reinforcing pattern 50 may be eight or less times the maximum reinforcement width RWmax. In addition, in the reinforcement length RL of the boundary reinforcing pattern 50, it may be advantageous in preventing cracks that a length RLin in a direction inward of an end of the external terminal pad 90 is smaller than a length RLout in a direction outward of the end of the external terminal pad 90, based on the virtual boundary VB4.

Referring back to FIGS. 1 to 9, a flexible printed circuit board 1 according to an exemplary embodiment in the present disclosure may include a first rigid area 200 and a flexible area 300.

One end of the flexible area 300 may be connected to the first rigid area 200 and have a smaller thickness than the first rigid area 200. The other end of the flexible area 300 may be connected to the second rigid area 400. The second rigid area 400 may have a larger thickness than the flexible area 300.

The flexible area 300 may include: a base film 10; a first circuit pattern 20 formed on an upper surface of the base film 10; a second circuit pattern 40 formed on a lower surface of the base film 10; and a boundary reinforcing pattern 50 formed to expand the first circuit pattern 20 in a width direction thereof based on a virtual boundary VB1 along which the first circuit pattern 20 and the second circuit pattern 40 meet each other with the base film 10 being interposed therebetween.

The virtual boundary VB1 defines a point where a line extending from an end of the second circuit pattern 40 in a thickness direction thereof passes through the first circuit pattern 20.

The flexible printed circuit board 1 according to an exemplary embodiment in the present disclosure may have a via hole 60 penetrating through the base film 10 and electrically connecting the first circuit pattern 20 and the second circuit pattern 40 to each other.

The first circuit pattern 20 may include a land portion 62 of the via hole 60. When the boundary reinforcing pattern 50 is adjacent to the land portion 62, a length RL1 of the boundary reinforcing pattern 50 from one of both ends thereof located further from the land portion 62 to a virtual boundary VB2 may be greater than a length RL2 of the boundary reinforcing pattern 50 extending from the virtual boundary VB2 to an edge 62E of the land portion 62.

The flexible printed circuit board 1 according to an exemplary embodiment in the present disclosure may further include: a coverlay film 70 covering the first circuit pattern 20; and a boundary reinforcing pattern 50 formed to expand the first circuit pattern 20 in a width direction thereof based on a virtual boundary VB3 between the coverlay film 70 and the first circuit pattern 20.

The coverlay film 70 may be connected to the first circuit pattern 20 by an adhesive, and the boundary reinforcing pattern 50 may be formed in a range in which the adhesive is applied to the first circuit pattern 20.

The flexible printed circuit board 1 according to an exemplary embodiment in the present disclosure may further include: an external terminal pad 90 connected to the first circuit pattern 20; and a boundary reinforcing pattern 50 formed to expand the first circuit pattern 20 in a width direction thereof based on a virtual boundary VB4 between the first circuit pattern 20 and the external terminal pad 90.

Electronic Device

Figure 10:
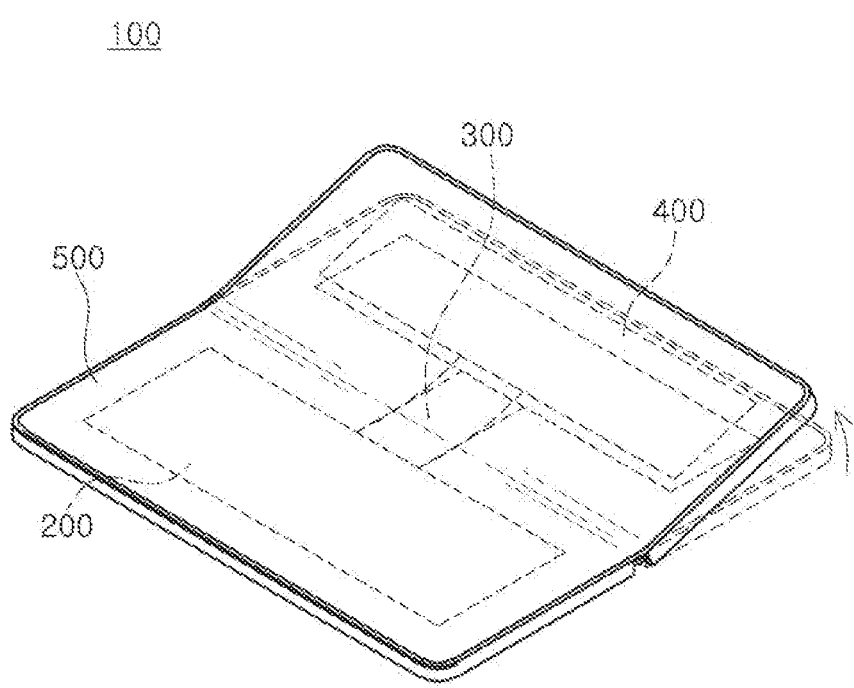
FIG. 10 is a schematic perspective view of a foldable terminal as an electronic device according to an exemplary embodiment in the present disclosure.

FIG. 10 is a schematic perspective view of a foldable terminal as an electronic device according to an exemplary embodiment in the present disclosure.

Referring to FIG. 10, the electronic device 100 according to an exemplary embodiment in the present disclosure may include a flexible printed circuit board 1 and a display module 500.

The flexible printed circuit board 1 may include a flexible area 300 and at least one of a first rigid area 200 and a second rigid area 400 connected to both ends of the flexible area 300, respectively.

The display module 500 may be bent, folded, or rolled, and accordingly, the flexible area 300 may be adjusted to have a required length.

Meanwhile, the display module 500 may be electrically connected to at least one of the first rigid area 200 and the second rigid area 400.

The flexible printed circuit board 1 according to any of the above-described exemplary embodiments may be applied to the electronic device 100 according to the present exemplary embodiment.

As set forth above, according to the exemplary embodiments in the present disclosure, the printed circuit board is capable of avoiding a crack in the circuit pattern even though repeated external forces are applied to the printed circuit board in a situation in which the thin and light conductive wires are used.

In addition, the printed circuit board is capable of avoiding a crack in a stepped portion between complicated conductive wire patterns, a crack at a boundary between a conductive wire pattern and a member covering the conductive wire pattern, and a crack at a boundary between a conductive wire pattern and an external terminal pad.

While exemplary embodiments have been shown and described above, it will be apparent to those skilled in the art that modifications and variations could be made without departing from the scope of the present invention as defined by the appended claims.

What is claimed is:
1. A flexible printed circuit board comprising:
   a base film;
   a first circuit pattern disposed on an upper surface of the base film;
   a second circuit pattern disposed on a lower surface of the base film; and
   a first boundary reinforcing pattern expanding the first circuit pattern in a width direction of the first circuit pattern based on a virtual boundary along which the first circuit pattern and the second circuit pattern meet each other in an overlay of the first circuit pattern and the second circuit pattern.
2. The flexible printed circuit board of claim 1, wherein the second circuit pattern corresponding to the first circuit pattern includes a copper foil having a width of 400 μm or more, and
   the first boundary reinforcing pattern includes a same copper foil as the first circuit pattern.
3. The flexible printed circuit board of claim 1, wherein a reinforcement length of the first boundary reinforcing pattern is 10 or less times a reinforcement width of the first boundary reinforcing pattern.
4. The flexible printed circuit board of claim 1, further comprising a via hole penetrating through the base film and connecting the first circuit pattern and the second circuit pattern to each other,
   wherein the first circuit pattern includes a land portion of the via hole and a second boundary reinforcing pattern being adjacent to the land portion, and
   Wherein a length of the second boundary reinforcing pattern from one of both ends thereof located further from the land portion to the virtual boundary is greater than a length of the second boundary reinforcing pattern extending from the virtual boundary to an edge of the land portion.
5. The flexible printed circuit board of claim 1, further comprising:
   a coverlay film covering the first circuit pattern; and
   a third boundary reinforcing pattern expanding the first circuit pattern in the width direction of the first circuit pattern based on a virtual boundary along which the coverlay film and the first circuit pattern meet each other in an overlay of the first circuit pattern and the coverlay film.

6. The flexible printed circuit board of claim 5, wherein a reinforcement length of the third boundary reinforcing pattern is 40 or less times a reinforcement width of the third boundary reinforcing pattern.

7. The flexible printed circuit board of claim 5, wherein the coverlay film is connected to the first circuit pattern by an adhesive, and
the third boundary reinforcing pattern reinforces the first circuit pattern in a range in which the adhesive is applied to the first circuit pattern.

8. The flexible printed circuit board of claim 1, further comprising:
an external terminal pad connected to the first circuit pattern; and
a fourth boundary reinforcing pattern expanding the first circuit pattern in the width direction of the first circuit pattern based on a virtual boundary connecting the first circuit pattern and an end of the external terminal pad.

9. The flexible printed circuit board of claim 8, wherein a reinforcement length of the fourth boundary reinforcing pattern is eight or less times a reinforcement width of the fourth boundary reinforcing pattern.

10. The flexible printed circuit board of claim 9, wherein in the reinforcement length of the fourth boundary reinforcing pattern, a length in a direction inward of the end of the external terminal pad is smaller than a length in a direction outwardly of the end of the external terminal pad, based on the virtual boundary connecting the first circuit pattern and the end of the external terminal pad.

11. A flexible printed circuit board comprising:
a first rigid area; and
a flexible area connected to the first rigid area and having a smaller thickness than the first rigid area,
wherein the flexible area includes:
a base film;
a first circuit pattern disposed on an upper surface of the base film;
a second circuit pattern disposed on a lower surface of the base film; and
a first boundary reinforcing pattern expanding the first circuit pattern in a width direction of the first circuit pattern based on a virtual boundary along which the first circuit pattern and the second circuit pattern meet each other in an overlay of the first circuit pattern and the second circuit pattern.

12. The flexible printed circuit board of claim 11, further comprising:
a coverlay film covering the first circuit pattern; and
a third boundary reinforcing pattern expanding the first circuit pattern in the width direction of the first circuit pattern based on a virtual boundary along which the coverlay film and the first circuit pattern meet each other in an overlay of the first circuit pattern and the coverlay film.

13. The flexible printed circuit board of claim 12, wherein the coverlay film is connected to the first circuit pattern by an adhesive, and
the third boundary reinforcing pattern reinforces the first circuit pattern in a range in which the adhesive is applied to the first circuit pattern.

14. The flexible printed circuit board of claim 11, further comprising a via hole penetrating through the base film and connecting the first circuit pattern and the second circuit pattern to each other,
the first circuit pattern includes a land portion of the via hole and a second boundary reinforcing pattern being adjacent to the land portion, and
wherein a length of the second boundary reinforcing pattern from one of both ends thereof located further from the land portion to the virtual boundary is greater than a length of the second boundary reinforcing pattern extending from the virtual boundary to an edge of the land portion.

15. The flexible printed circuit board of claim 11, further comprising:
an external terminal pad connected to the first circuit pattern; and
a fourth boundary reinforcing pattern expanding the first circuit pattern in the width direction of the first circuit pattern based on a virtual boundary connecting the first circuit pattern and an end of the external terminal pad.

16. An electronic device comprising:
a flexible printed circuit board including a flexible area and at least one of a first rigid area and a second rigid area connected to the flexible area; and
a display module connected to at least one of the first rigid area and the second rigid area,
wherein the flexible area includes:
a base film;
a first circuit pattern disposed on an upper surface of the base film;
a second circuit pattern disposed on a lower surface of the base film; and
a boundary reinforcing pattern expanding the first circuit pattern in a width direction of the first circuit pattern based on a virtual boundary along which the first circuit pattern and the second circuit pattern meet each other in an overlay of the first circuit pattern and the second circuit pattern.

17. The electronic device of claim 16, wherein a thickness of the flexible area is less than a thickness of the first rigid area and a thickness of the second rigid area.

* * * * *